United States Patent
Ishii et al.

(10) Patent No.: US 7,196,356 B2
(45) Date of Patent: Mar. 27, 2007

(54) SUBMOUNT AND SEMICONDUCTOR DEVICE

(75) Inventors: Takashi Ishii, Itami (JP); Kenjiro Higaki, Itami (JP); Yasushi Tsuzuki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/520,385

(22) PCT Filed: Jul. 30, 2003

(86) PCT No.: PCT/JP03/09706

§ 371 (c)(1),
(2), (4) Date: Jan. 3, 2005

(87) PCT Pub. No.: WO2004/015756

PCT Pub. Date: Feb. 19, 2004

(65) Prior Publication Data

US 2005/0194690 A1  Sep. 8, 2005

(30) Foreign Application Priority Data

Aug. 9, 2002  (JP) .............................. 2002-233155

(51) Int. Cl.
*H01L 31/12* (2006.01)
(52) U.S. Cl. .................... 257/81; 257/99; 257/772; 257/E31.012
(58) Field of Classification Search .................. 257/81, 257/99, 678, 750, 772
See application file for complete search history.

(56) References Cited

U.S. PATENT DOCUMENTS

| 4,137,076 | A | * | 1/1979 | Hoyer et al. ................... 75/241 |
| 4,585,706 | A | * | 4/1986 | Takeda et al. ............... 428/620 |
| 5,479,029 | A | * | 12/1995 | Uchida et al. ................ 257/81 |
| 5,990,560 | A | * | 11/1999 | Coult et al. ................. 257/772 |

(Continued)

FOREIGN PATENT DOCUMENTS

| JP | 5-190973 | 7/1993 |
| JP | 2002-368020 | 12/2002 |
| JP | 2003-258360 | 9/2003 |

OTHER PUBLICATIONS

Patent Abstracts of Japan for JP5-190973 published on Jul. 30, 1993.

(Continued)

*Primary Examiner*—Douglas W. Owens
*Assistant Examiner*—Colleen Matthews
(74) *Attorney, Agent, or Firm*—Darby & Darby

(57) ABSTRACT

The present invention provides a submount that allows a semiconductor light-emitting element to be attached with a high bonding strength.

A submount 3 is equipped with a substrate 3 and a solder layer 8 formed on a primary surface 4f of the substrate 4. The density of the solder layer 8 is at least 50% and no more than 99.9% of the theoretical density of the material used in the solder layer 8. The solder layer 8 contains at least one of the following list: gold-tin alloy; silver-tin alloy; and lead-tin alloy. The solder layer 8 before it is melted is formed on the substrate 4 and includes an Ag film 8b and an Sn film 8a formed on the Ag film 8b. The submount 3 further includes an Au film 6 formed between the substrate 4 and the solder layer 8.

13 Claims, 2 Drawing Sheets

U.S. PATENT DOCUMENTS

| | | | | |
|---|---|---|---|---|
| 6,521,477 | B1 * | 2/2003 | Gooch et al. | 438/106 |
| 6,696,103 | B1 * | 2/2004 | Shimoda et al. | 427/374.7 |
| 6,876,008 | B2 * | 4/2005 | Bhat et al. | 257/99 |
| 6,961,357 | B2 * | 11/2005 | Moriya et al. | 372/34 |
| 2003/0015721 | A1 * | 1/2003 | Slater et al. | 257/99 |
| 2005/0205875 | A1 * | 9/2005 | Shei et al. | 257/79 |

OTHER PUBLICATIONS

Patent Abstracts of Japan for JP2002-368020 published on Dec. 20, 2002.

Patent Abstracts of Japan for JP2003-258360 published on Sep. 12, 2003.

International Search Report for PCT/JP03/09706 mailed Oct. 7, 2003.

X-Ray Reflectivity Technique (GIXR), Toray Research Center "The TRC News", No. 59 (Apr. 1997) p. 11-16.

English Translation of X-Ray Reflectivity Technique (GIXR), Toray Research Center "The TRC News", No. 59 (Apr. 1997) p. 11-16.

* cited by examiner

US 7,196,356 B2

SUBMOUNT AND SEMICONDUCTOR DEVICE

CROSS-REFERENCE TO PRIOR APPLICATION

This is a U.S. National Phase application under 35 U.S.C. §371 of International Patent Application No. PCT/JP2003/009706 filed Jul. 30, 2003, and claims the benefit of Japanese Patent Application No. 2002-233155 filed Aug. 9, 2002 both of which are incorporated by reference herein. The International Application was published in Japanese on Feb. 19, 2004 as WO 2004/015756 A1 under PCT Article 21(2).

TECHNICAL FIELD

The present invention relates to a submount and semiconductor device that uses the same. More specifically, the present invention relates to a submount on which a semiconductor light-emitting element is mounted and a semiconductor device that uses this submount. In the present invention, a "semiconductor light-emitting element" refers to an element such as a laser diode or a light-emitting diode.

BACKGROUND ART

Semiconductor devices equipped with semiconductor light-emitting elements are widely known. One of these types of semiconductor devices, shown in FIG. 4, is made by mounting a semiconductor light-emitting element in a submount 3. FIG. 4 is a simplified cross-section drawing illustrating how the conventional semiconductor device is made. The conventional method for making the semiconductor device will be described, with references to FIG. 4.

As shown in FIG. 4, in the conventional method for making a semiconductor device 1, the submount 3 is prepared for mounting of a laser diode 2, which serves as the semiconductor light-emitting element. The submount is formed from: a ceramic substrate 4; a layered film (Ti/Pt film layer 5) formed on this substrate from a film containing titanium (Ti) and a film containing platinum (Pt); a gold (Au) film 6 formed on the layered film and serving as an electrode layer; a barrier layer 107 formed on this film containing platinum (Pt); and a solder layer 108 formed on this barrier layer containing gold (Au) and tin (Sn). The layered Ti/Pt film, the Au film, the solder barrier layer, and the solder layer can be formed using conventional film-forming methods such as vaporization, sputtering, or plating and conventional patterning methods such as photolithography or metal masking.

After preparing the submount as shown in FIG. 4, the solder on the submount is heated and melted and the laser diode serving as the semiconductor light-emitting element is mounted on a predetermined position on the solder (a die bond step is performed). Then, a heat sink not shown in the figure is connected and secured to the back of the submount using solder or the like, resulting in the semiconductor device equipped with the semiconductor light-emitting element.

In order to reduce thermal damage to the semiconductor light-emitting element during the semiconductor light-emitting element die-bonding step, the solder layer may be formed from solder that has a melting point lower than that of the AuSn-based solder described above, e.g., lead (Pb) tin (Sn) based solder or silver (Ag) tin (Sn) based solder. If an AuSn-based solder is used, a lead-free product can be provided.

There is currently a trend toward higher output in semiconductor light-emitting element to handle applications such as higher output in laser processing machines and higher write speeds in CD and DVD devices. The semiconductor devices used in these require higher degrees of practical reliability. One requirement for this is a high bonding strength between the semiconductor light-emitting element and the submount.

DISCLOSURE OF INVENTION

The object of the present invention is to overcome the problems described above and to provide a submount capable of forming a high-strength bond with a semiconductor light-emitting element and a semiconductor device that uses this submount.

A submount according to the present invention is equipped with a submount equipped with a submount substrate and a solder layer formed on a primary surface of the submount substrate. The density of the solder layer before melting is at least 50% and no more than 99.9% of the theoretical density of the material used in the solder layer.

In this type of structure, since the density of the solder layer before melting is at least 50% and no more than 99.9% of the theoretical density of the material used in the solder layer, the solder layer density is high. As a result, the bonding strength between the submount and the semiconductor light-emitting element mounted on the solder layer can be improved. If the density of the solder layer is less than 50% of the theoretical density, the reduced density of the solder layer prevents adequate improvement in the bonding strength. A density greater than 99.9% of the theoretical density is technically difficult.

Preferably, the solder layer contains at least one of the following list: gold-tin alloy; silver-tin alloy; and lead-tin alloy. More preferably, the solder layer has as its main component silver tin based solder. In this case, a lead-free technology can be provided and the bonding temperature for the semiconductor light-emitting element can be kept low, thus preventing heat-related damage to the semiconductor light-emitting element.

Preferably, the solder layer before melting is formed on the submount substrate and includes a first layer having silver (Ag) as a main component and a second layer, formed on the first layer, having tin (Sn) as a main component. For example, an Ag film can be used for the first layer and an Sn film can be used for the second layer.

Preferably, the submount further includes an electrode layer formed between the submount substrate and the solder layer.

Preferably, the electrode layer contains gold.

Preferably, the submount further includes a solder adhesion layer formed between the solder layer and the electrode layer. The solder adhesion layer contains: a noble metal layer disposed on the solder layer side and having as a main component at least one of the following list: gold (Au), platinum (Pt), palladium (Pd), and alloys thereof; and a transition element layer disposed on the electrode layer side and having as a main component at least one of the following list: titanium (Ti); vanadium (V); chromium (Cr); zirconium (Zr); niobium (Nb); and alloys thereof. This makes it possible to further improve the bonding strength of the solder.

The transition element can be a layer having as its main component at least one of the following group: a group 4A element; a group 5A element; a group 6A element; or an alloy thereof. Also, multiple layers with different compositions can be layered.

In order to improve bonding strength and also for price considerations, it would be preferable for the transition element layer and the noble metal layer to have film thicknesses of more than 0 and no more than 1 micron. More preferably, the transition element would have a film thickness of at least 0.01 micron and no more than 0.2 micron. The noble metal layer would have a film thickness of at least 0.01 micron and no more than 0.1 micron.

Preferably, the submount further includes an adhesion layer and a diffusion barrier layer formed between the submount substrate and the solder layer. The adhesion layer is formed so as to be in contact with the primary surface of the submount substrate. The diffusion barrier layer is formed on the adhesion layer.

Preferably, the adhesion layer contains titanium and the diffusion barrier layer contains platinum.

Preferably, the submount substrate contains sintered aluminum nitride (AlN) or sintered alumina ($Al_2O_3$). More preferably, the submount substrate contains sintered aluminum nitride. In this case, since aluminum nitride has high thermal conductivity, a submount with superior heat-dissipation properties can be provided. Also, the submount substrate can contain sintered silicon carbide (SiC), a copper tungsten alloy, or a composite body.

In the semiconductor device according to the present invention is equipped with a submount as described above and a semiconductor light-emitting element mounted on the solder layer of the submount.

In this type of semiconductor device, the semiconductor light-emitting element can be bonded to the submount with a high bonding strength and the practical reliability of the semiconductor device can be improved.

The above, and other objects, features and advantages of the present invention will become apparent from the following description read in conjunction with the accompanying drawings, in which like reference numerals designate the same elements.

BEST MODE FOR CARRYING OUT THE INVENTION

First Embodiment

Figure 1:
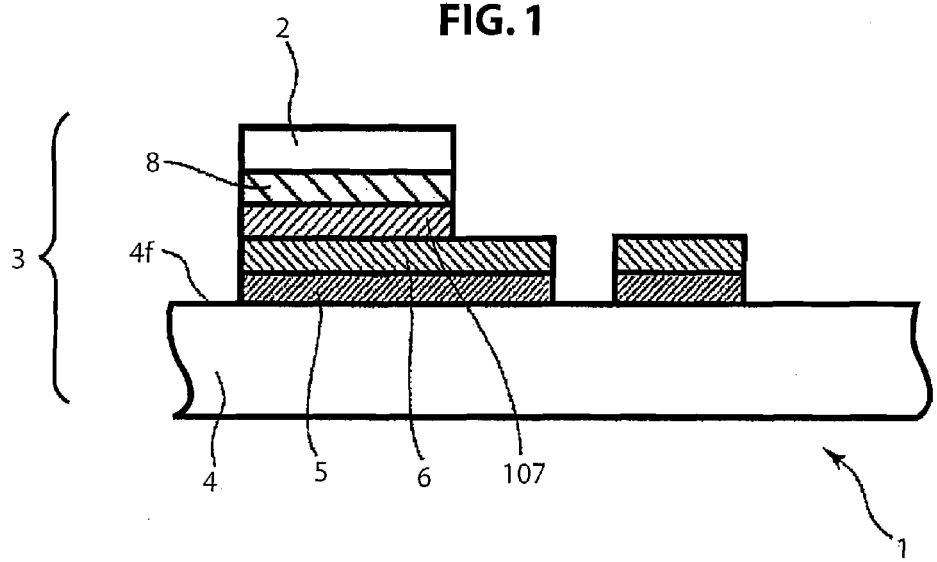
FIG. 1 is a simplified cross-section drawing showing a semiconductor device according to a first embodiment of the present invention.

An embodiment of the present invention will be described, with references to the figures. Elements that are identical or correspond to each other in these figures are assigned the same numerals and overlapping descriptions will be omitted. FIG. 1 shows a simplified cross-section drawing of a semiconductor device according to the first embodiment of the present invention. As shown in FIG. 1, the semiconductor device 1 is equipped with: a submount 3; and a laser diode 2, serving as a semiconductor light-emitting element, mounted on the submount 3 via a solder layer 8. The solder layer 8 has a density of at least 50% and no more than 99.9% of the theoretical density of the AuSn-based solder used in the solder layer 8.

The submount 3 is formed by layering the following onto a substrate 4: a Ti/Pt layered film 5; a gold (Au) film 6; a solder barrier layer 107; and a solder layer 8. The semiconductor device shown in FIG. 1 is made by first preparing the submount 3 onto which the laser diode 2 is to be mounted. The submount is formed from: a ceramic substrate 4; a layered film (Ti/Pt layered film 5) formed on the substrate from a film (adhesion layer) containing titanium (Ti) and a film (diffusion barrier) containing platinum (Pt); a gold (Au) film 6 formed on the layered film and serving as an electrode layer; a barrier layer 107 formed on this film containing platinum (Pt); and a solder layer 8 formed on this barrier layer containing gold (Ag) and tin (Sn). The layered Ti/Pt film, the Au film, the solder barrier layer, and the solder layer can be formed using conventional film-forming methods such as vaporization, sputtering, or plating and conventional patterning methods such as photolithography or metal masking.

Besides silver-tin solder, the solder layer 8 can alternatively be formed from gold-tin or lead-tin solder.

An example of a method for measuring the density of solder layer 8 is the X-ray reflectivity technique (GIXR) described in pages 11–16 of the Toray Research Center's "The TRC News", No. 59 (April 1997).

Once the submount shown in FIG. 1 has been prepared, the solder on the submount is heated and melted and the laser diode serving as the semiconductor light-emitting element is mounted to the predetermined position on the solder (a die-bond operation is performed). Then, the back side of the submount is connected and secured with solder or the like to a heat sink not shown in the figure, resulting in a semiconductor device equipped with a semiconductor light-emitting element.

In this type of submount and semiconductor device according to the present invention, the bonding strength between the semiconductor light-emitting element and the submount is improved because the pre-melt solder layer has a density that is at least 50% and no more than 99.9% of the theoretical density. As a result, the practical reliability of the semiconductor device can be further improved.

Second Embodiment

Figure 2:
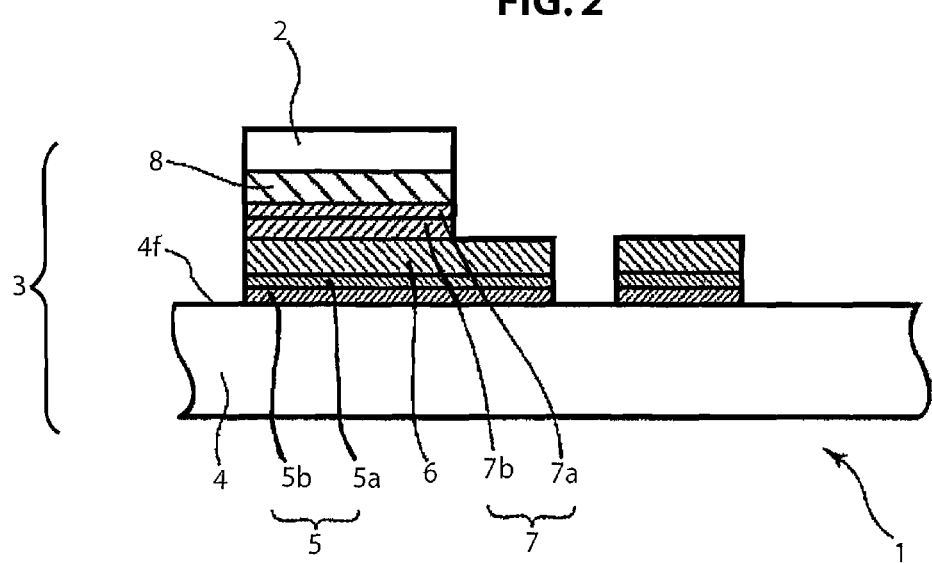
FIG. 2 is a simplified cross-section drawing showing a semiconductor device according to a second embodiment of the present invention.
Figure 3:
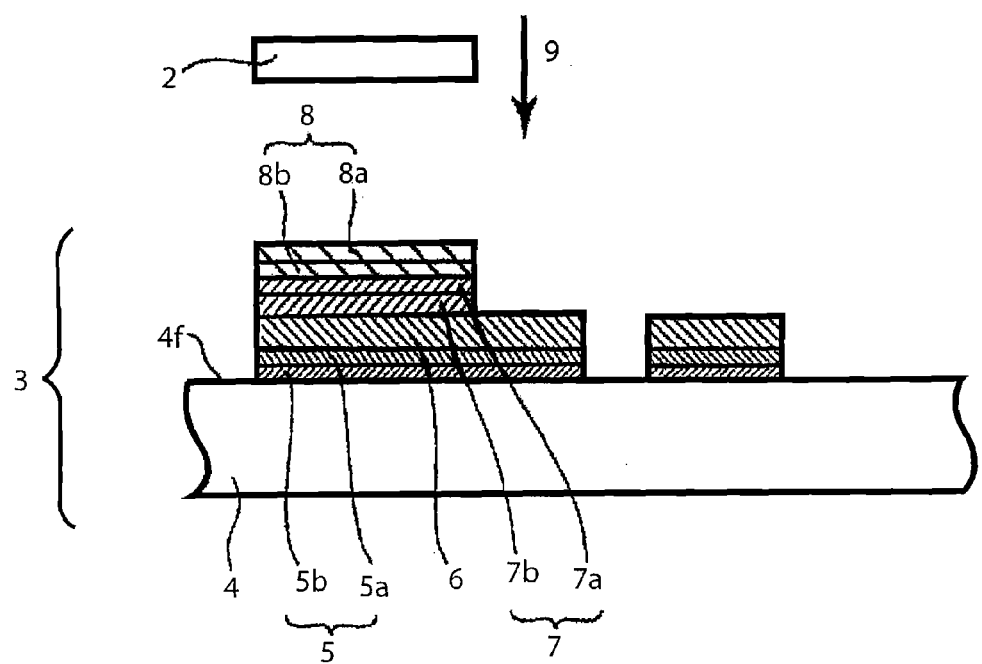
FIG. 3 is a simplified cross-section drawing illustrating how the semiconductor device shown in FIG. 2 is made.
Figure 4:
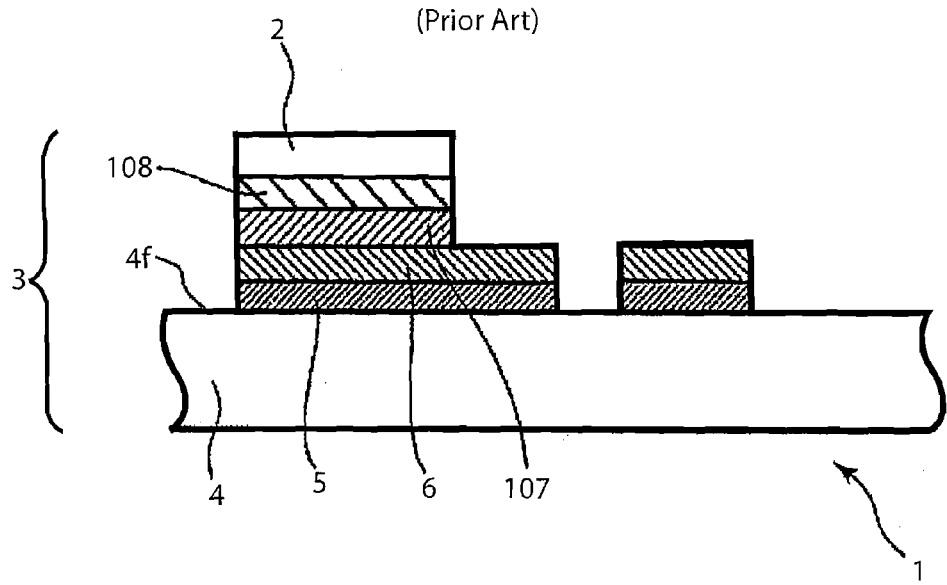
FIG. 4 is a simplified cross-section drawing illustrating how a conventional semiconductor device is made.

FIG. 2 shows a simplified cross-section drawing of a semiconductor device according to a second embodiment of the present invention. FIG. 3 is a simplified cross-section drawing for the purpose of describing how the semiconductor device shown in FIG. 2 is made, and shows the state before solder is melted.

As shown in FIG. 2, the semiconductor device 1 is formed as a structure wherein a laser diode 2 serving as a semiconductor light-emitting element is mounted onto a submount 3. The submount is formed from: a submount substrate 4 formed from a material such as sintered aluminum nitride (AlN); a layered film 5 (Ti/Pt layered film 5) formed from a titanium (Ti) film 5b serving as an adhesion layer and a platinum (Pt) film 5a serving as a diffusion barrier layer; a gold (Au) film 6 formed on the Ti/Pt layered film 5 and serving as an electrode layer; and a solder adhesion layer 7 formed from a titanium (Ti) film 7b serving as a transition element layer and a platinum (Pt) film 7a serving as a noble metal layer; and a solder layer 8 formed on the solder adhesion layer and formed from a silver tin (AgSn) based solder.

As shown in FIG. 2 and FIG. 3, the laser diode and the submount are connected by a solder layer. The width of the laser diode, the width of the solder layer, and the width of the solder adhesion layer are roughly identical. Also, before and after the solder is melted, the width and the length of the solder layer can be greater than or less than the width and the length of the laser diode, and the width and the length of the solder adhesion layer can be greater than or less than the width and the length of the solder layer.

In the semiconductor device shown in FIG. 2, the substrate in the submount can be formed from ceramics, semiconductor, or metal. Example of ceramics include ceramics with sintered aluminum nitride described above, aluminum oxide ($Al_2O_3$), silicon carbide (SiC), or silicon nitride ($Si_3N_4$) as the main component. Examples of semiconductor include those with silicon as the main component. Examples of metal include copper (Cu), tungsten (W), molybdenum (Mo), iron (Fe), alloys containing any of these, and composite materials such as copper tungsten (CuW).

It would be preferable for the substrate to use a material having high thermal conductivity. The thermal conductivity would preferably be at least 100 W/mK and would more preferably be at least 170 W/mK. Also, it would be preferable for the thermal expansion coefficient to approximate the thermal expansion coefficient of the material used in the laser diode. For example, if the laser diode is formed with gallium arsenide (GaAs) or indium phosphide (InP), the thermal expansion coefficient would preferably be no more than $10 \times 10^{-6}$ and more preferably no more than $5 \times 10^{-6}$.

If ceramic is used in the substrate 4, a through-hole that connects the upper surface and the opposing lower surface or a via hole filled with a conductor (via fill) can be formed. The main component of the conductor filling the via hole (the via fill) would preferably be a high melting point metal, particularly tungsten (W) or molybdenum (Mo). A transition metal such as titanium (Ti) or a glass component or a substrate material (e.g., aluminum nitride (AlN)) can also be added to this.

The surface roughness of the substrate is preferably such that Ra is no more than 1 micron and more preferably no more than 0.1 micron. If Ra exceeds 1 micron or the flatness exceeds 5 microns, a gap can be formed with the submount when the laser diode is bonded, leading to a reduction in the cooling of the laser diode. Surface roughness Ra and flatness are defined by JIS standards (JIS B0601 and JIS B0621 respectively).

The Ti film (film containing titanium (Ti)) in the Ti/Pt layered film is an adhesion layer for increasing adhesion with the substrate and is formed so that it comes into contact with the upper surface of the substrate. The material used can be, for example, (Ti), vanadium (V), chromium (Cr), a nickel-chromium alloy (NiCr), zirconium (Zr), Niobium (Nb), Tantalum (Ta), and compounds thereof. Also, if the substrate is a metal, an alloy, or a composite material containing metal, the adhesion layer does not need to be present.

The platinum (Pt) film in the Ti/Pt layered film is a diffusion barrier layer and is formed on the upper surface of the Ti film. The material used can be, for example, platinum (Pt), palladium (Pd), a nickel-chromium alloy (NiCr), nickel (Ni), molybdenum (Mo), or the like. Also, for the electrode layer, Au is generally used as the main component.

The solder adhesion layer and the electrode layer can be interposed with a solder barrier layer. The material used can be, for example, platinum (Pt), a nickel-chromium alloy (NiCr), nickel (Ni), or the like. The width and the length of the barrier layer can be greater than or less than those of the solder adhesion layer.

In addition to the silver tin (AgSn) based solder described above, the material for the solder layer can be, for example: low melting point metals solder such as tin (Sn) or indium (In); alloy solder such as gold tin (AuSn) based solder, gold germanium (AuGe) based solder, lead tin (PbSn) based solder, or indium tin (InSn) based solder; or combinations thereof. Also, before melting, the solder layer can be formed by layering the different types of metals of the alloy solders described above, as shown in elements 8a, 8b in FIG. 3, for example. If silver tin (AgSn) based solder is used for the solder layer, it would be preferable for silver (Ag) to be at least 0 percent by mass and no more than 72 percent by mass. If gold tin (AuSn) based solder is used, it would be preferable for gold (Au) to be either at least 65 percent by mass and no more than 85 percent by mass or at least 5 percent by mass and no more than 20 percent by mass.

The Ti/Pt layered film, the Au film, the solder adhesion layer, the solder barrier layer, and the solder layer are referred to collectively as the metallized layer. Conventional film-forming methods can be used to form the metallized layer, e.g., thin film forming methods such as vaporization and sputtering, or plating methods. Examples of patterning methods for the Ti/Pt layered film, the Au film, the solder adhesion layer, and the solder layer include the lift-off method using photolithography, chemical etching, dry etching, and metal masking.

It would be preferable for the thickness of the titanium (Ti) film in the Ti/Pt layered film to be at least 0.01 micron and no more than 1.0 micron, and the thickness of the platinum (Pt) film to be at least 0.01 micron and no more than 1.5 micron. It would be preferable for the thickness of the Au film serving as the electrode film to be at least 0.1 micron and no more than 10 microns and the thickness of the solder layer to be at least 0.1 micron and no more than 10 microns. If a barrier layer is to be formed, the thickness would preferably be at least 0.01 micron and no more than 1.5 micron.

Examples of the material for the semiconductor light-emitting element include compound semiconductors such as GaAs-based, InP-based, and GaN-based semiconductors. In lower surface light emitting laser diodes (where the light-emitting section of the laser diode is formed at the surface of the laser diode facing the section where the laser diode is boned to the solder layer), light-emitting section, which is the section generating heat, is disposed close to the substrate, thus further improving the heat dissipation of the semiconductor device.

On the surface of the laser diode is formed an insulative layer such as a silicon dioxide film ($SiO_2$) and a metallized layer such as an electrode layer. In order to ensure adequate wetting with the solder layer, the thickness of the gold (Au) layer serving as the electrode layer would be preferably at least 0.1 micron and no more than 10 microns.

While not shown in the figure, a heat sink can be connected using solder to the semiconductor device shown in FIG. 2. More specifically, once the adhesion layer and the diffusion barrier layer and the like are formed on the surface of the substrate opposite from where the Ti/Pt layered film is formed, a solder sheet (solder foil) can be, for example, interposed between the back side of the substrate and the heat sink, and the heat sink can be bonded using this solder foil. The solder foil can also be formed on the metallized layer on the back side of the substrate ahead of time. In this case, it would be possible to bond the laser diode and the heat sink to the substrate at the same time.

The material for the heat sink can be, for example, metal or ceramic. Examples of metals include copper (Cu), aluminum (Al), tungsten (W), molybdenum (Mo), iron (Fe), and alloys and composite materials containing any of these. In order to facilitate soldering, it would be preferable to form nickel (Ni), gold (Au), or a film containing these metals on the surface of the heat sink. These films can be formed using vaporization or plating. The thermal conductivity of the heat sink would preferably be at least 100 W/mK.

Next, using FIG. 3, the making of the semiconductor device shown in FIG. 2 using sintered aluminum nitride as the substrate will be described.

In the first process, the substrate is made. Since these types of submounts have lengths and widths that are very small, on the order of a few millimeters, a substrate parent material, e.g., with length and width of approximately 50 mm, is generally prepared, a metallized layer is formed on this, and the parent material is cut finely into a predetermined size. The following description will follow this method. Thus, in this step, the size of the parent substrate is, e.g., 50 mm wide, 50 mm long, and 0.4 mm thick. The sintered aluminum nitride serving as the material for the substrate can be made using standard methods.

Next, in the second process, the surface of the substrate is abraded. The surface roughness of the abraded substrate would preferably be no more than 1.0 micron Ra and more preferably no more than 0.1 micron. The abrading can be performed with standard methods using, e.g., a disc grinder, a sand blaster, sandpaper, or abrasive particles.

Next, as shown in FIG. 3, a resist pattern is formed in the third process to form predetermined patterns for the Ti film 5b serving as the adhesion layer, the Pt film 5a serving as the diffusion barrier layer, and the Au film 6 serving as the electrode layer. This resist patterning, e.g., using photolithography, forms resist films on the sections of the substrate outside of the regions where the respective films are to be formed.

In the fourth process, the Ti film, serving as the adhesion layer, is vaporized. The film thickness can be, e.g., 0.1 micron.

In the fifth process, a Pt film serving as the diffusion barrier layer is formed on the adhesion layer. The film thickness can be, e.g., 0.2 microns.

In the sixth process, Au film serving as the electrode layer is vaporized. The film thickness can be, e.g., 0.6 microns.

The seventh process is a lift-off process. In this process, a resist removal fluid is used to remove the resist film formed in the patterning performed in the third process along with the adhesion layer, the diffusion barrier layer, and the electrode layer on top of the resist film. As a result, three films having predetermined patterns are formed on the substrate.

In the eighth process, the solder adhesion layer is vaporized. In this step, metal masking is used to vaporize the Ti film 7b serving as the transition element layer on the electrode layer and then the Pt film 7a serving as the noble metal layer. The thicknesses of the Ti film and the Pt film formed in this manner can be, e.g., 0.08 microns and 0.05 microns respectively.

Next, in the ninth process, vacuum vaporization is performed to form the solder layer 8 on the solder adhesion layer. Here, metal masking is used vaporize the Ag film 8 serving as the layered Ag/Sn solder layer onto the solder adhesion layer. Then, the Sn film 8a is vaporized. The thicknesses of the Ag film and the Sn film are, e.g., 1.5 microns and 3.0 microns respectively.

In the process for forming the solder layer, it would be preferable to reduce gas impurities, e.g., water and oxygen, in the film-forming atmosphere by preferably using a chamber pressure before film-formation (ultimate degree of vacuum) of no more than $5.0 \times 10^{-4}$ Pa, and more preferably no more than $1.0 \times 10^{-4}$ Pa. Also, in order to improve adhesiveness of the solder layer to the solder adhesion layer, it would be preferable for the surface temperature of the substrate during formation of the solder layer to be at least 20 deg C. and no more than a temperature 10 deg C. below the liquid-phase temperature of the solder.

In forming the solder layer 8, the density of the solder layer 8 must be at least 50% and no more than 99.9% of the theoretical density. One example of how to do this is to set the film-formation rate of the solder layer 8 to be at least 1.3 nm/sec. The principles behind the increase in density that takes place when the film-formation rate is increased are not clear. It is believed that in general, if the film-formation rate is low, the atoms that make up the solder layer move to stable positions so that the atoms do not fill up the solder layer to maximum density, thus reducing the density of the solder layer. In contrast, with a high film-formation rate, the atoms that make up the solder layer are surrounded by other atoms before they are able to move to stable position so that they are prevented from moving. As a result, the solder layer can be filled with atoms almost to maximum density, thus increasing solder layer density.

As an alternative to the metal masking method described above, the solder layer and the solder adhesion layer with the predetermined patterns can be formed using photolithography, as described previously.

Next, in the tenth process, the parent substrate is cut to the length and width of the desired submount to obtain the submount shown in FIG. 2.

Next, in the eleventh process, the laser diode 2 serving as the semiconductor light-emitting element is bonded. More specifically, as shown in FIG. 3, the element is aligned as indicated by the arrow 9 on the solder layer 8 that has been heated and made molten, thus bonding the element to the submount via the solder layer. This completes the semiconductor device 1 in FIG. 2.

As in the solder layer 8 in the first embodiment, the solder layer 8 according to the second embodiment described above has a density that is at least 50% and no more than 99.9% of the theoretical density of silver tin based solder.

With the submount and semiconductor according to the present invention as described above, the solder layer before melting has a density that is at least 50% and no more than 99.9% of the theoretical density, thus providing increased bonding strength between the semiconductor light-emitting element and the submount. As a result, the practical reliability of the semiconductor device is improved.

Embodiment (Making and Evaluating Samples)

Based on the method described above, submounts were made from sample 1 through sample 11 indicated in Table 1. Samples 2 through 11 correspond to embodiments and sample 1 corresponds to a comparative example.

TABLE 1

| | | Solder Layer | | | | Laser diode | |
|---|---|---|---|---|---|---|---|
| Sample Number | Substrate | Solder composition ratio (mass ratio) | Solder film thickness (microns) | Solder relative density (%) | Solder film-formation rate (nm/s) | Bonding temperature | Die Shear strength (MPa) |
| 1 | Sintered AlN | Ag:Sn = 32:68 | 1.5/4.0 (layered Ag/Sn) | 42 | 1 | 250 | 37 |
| 2 | Sintered AlN | Ag:Sn = 32:68 | 1.5/4.0 (layered Ag/Sn) | 62 | 1.5 | 250 | 47 |
| 3 | Sintered AlN | Ag:Sn = 32:68 | 1.5/4.0 (layered Ag/Sn) | 99 | 2 | 250 | 52 |
| 4 | Sintered AlN | Ag:Sn = 32:68 | 1.5/4.0 (layered Ag/Sn) | 92 | 5 | 250 | 51 |
| 5 | Sintered AlN | Ag:Sn = 32:68 | 1.5/4.0 (layered Ag/Sn) | 88 | 9 | 250 | 50 |
| 6 | Sintered SiC | Ag:Sn = 32:68 | 1.5/4.0 (layered Ag/Sn) | 94 | 2 | 250 | 49 |
| 7 | Sintered $Al_2O_3$ | Ag:Sn = 32:68 | 1.5/4.0 (layered Ag/Sn) | 95 | 2 | 250 | 47 |
| 8 | CuW | Ag:Sn = 32:68 | 1.5/4.0 (layered Ag/Sn) | 97 | 2 | 250 | 48 |
| 9 | Sintered AlN | Ag:Sn = 10:90 | 3.5 (alloy) | 96 | 2 | 250 | 49 |
| 10 | Sintered AlN | Au:Sn = 80:20 | 3.5 (alloy) | 93 | 2 | 285 | 47 |
| 11 | Sintered AlN | Au:Sn = 10:90 | 3.5 (alloy) | 94 | 2 | 230 | 45 |

First, the substrates were prepared using the materials from Table 1. The dimensions were all 50 mm (l)×50 mm (w)×0.4 mm (thickness). The surfaces of the substrates were abraded so that the roughness Ra of the main surfaces 4f were 0.05 microns. Next, the lift-off method using photolithography and vacuum vaporization were used to form a metallized layer consisting of the Ti film 5b with 0.1 micron thickness, the Pt film 5a with 0.2 micron thickness, and the Au film 6 with 0.6 micron thickness. For sample 8, in place of this metallized layer, a metallized layer formed from a Ni plating film with 1.0 micron thickness and an Au plating film with 1.0 micron thickness was prepared.

Next, a transition element layer (Ti, 0.06 micron thickness) and a noble metal layer (Pt, 0.05 micron thickness) serving as the solder adhesion layer 7 was formed on the metallized layer using metal masking and vacuum vaporization.

Then, for all the samples, solder layers 8 were formed using metal masking and vacuum vaporization. The composition, film thickness, and film-formation rate of the solder layers were as shown in Table 1. In Table 1, the "solder composition ratio" refers to the mass ratio of the elements in the solder layer. The "solder relative density" refers to the density of the solder layer relative to the theoretical density of the material used in the solder layer.

The substrates 4 were then cut to form ten submounts each of samples 1 through 11, each submount being 1.2 mm (l)×1.5 mm (w)×0.3 mm (thickness). Then, for each sample, the solder layer was heated and melted in a nitrogen atmosphere and the laser diode 2 was bonded. The bonding temperatures were as shown in Table 1.

The bonding strength of the laser diodes to the submounts in the semiconductor devices 1 obtained in this manner (see FIG. 1) were measured using a die shear strength test based on MIL-STD-883C METHOD 2019.4, and the average bonding strengths for the ten samples in each sample number were determined. The results are shown in Table 1.

The results in Table 1 indicate that relative to the comparative example, the submount and the semiconductor device according to the present invention provides improved bonding strength between the semiconductor light-emitting element and the submount.

(Relationship Between the Film-Formation Rate and the Solder Layer)

The film-formation rate of the solder layer was varied and the relationship between the film-formation rate and the solder layer was studied. As a result, it was found that the if the film-formation rate of the solder layer is at least 1.3 nm/sec, the solder layer would have a density of at least 50% and no more than 99.9% of the theoretical density of the material used in the solder layer. If the solder layer has a film-formation rate of at least 1.8 nm/sec and no more than 10 nm/sec, it was found that the solder layer would have a density of at least 80% and no more than 99.9% of the theoretical density of the material used in the solder layer. These ranges provided especially preferable bonding strengths.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

The invention claimed is:

1. A submount comprising:
    a submount substrate, said submount substrate having a surface roughness $R_a$ that is less than or equal to 0.1 micron and a flatness that is less than or equal to 5 microns; and
    a solder layer comprising at least a first metal and a second metal in a specific mass ratio formed on a primary surface of said submount substrate, said solder layer having a thickness that is at least 0.1 micron and is no more than 10 microns, and having a relative density before melting that is at least 80% and no more than 99.9% of the theoretical density of said solder layer.

2. A submount as described in claim 1 wherein said solder layer contains at least one of the following: gold-tin alloy, silver-tin alloy, and lead-tin alloy.

3. A submount as described in claim 1 wherein said solder layer before melting is formed on said submount substrate and includes a first layer containing silver and a second layer, formed on said first layer, containing tin.

4. A submount as described in claim 1 wherein said submount substrate contains sintered aluminum nitride or sintered alumina.

5. A semiconductor device comprising:
a submount as described in claim 1; and
a semiconductor light-emitting element mounted on said solder layer of said submount.

6. The submount as described in claim 1, wherein said first metal is gold and said gold is either at least 65% by mass and no more than 85% by mass, or at least 5% by mass and no more than 20% by mass of said solder layer.

7. The submount as described in claim 1, wherein said first metal is silver and said silver is no more than 72% by mass of said solder layer.

8. A submount as described in claim 1 further comprising an electrode layer formed between said submount substrate and said solder layer.

9. A submount as described in claim 8 wherein said electrode layer contains gold.

10. A submount as described in claim 8 further comprising a solder adhesion layer formed between said solder layer and said electrode layer;

wherein said solder adhesion layer contains: a noble metal layer disposed on said solder layer side and containing at least one of the following: gold, platinum, palladium, and alloys thereof; and a transition element layer disposed on said electrode layer side and containing at least one of the following: titanium; vanadium; chromium; zirconium; niobium; and alloys thereof.

11. A submount as described in claim 1 further comprising an adhesion layer and a diffusion barrier layer formed between said submount substrate and said solder layer;

wherein said adhesion layer is formed to contact said primary surface of said submount substrate; and said diffusion barrier layer is formed on said adhesion layer.

12. A submount as described in claim 11 wherein said adhesion layer contains titanium and said diffusion barrier layer contains platinum.

13. A submount comprising:

a submount substrate; and a solder layer comprising at least a first metal and a second metal in a specific mass ratio formed on a primary surface of said submount substrate, wherein said solder layer is formed on the primary surface of said submount substrate by a film-formation process having a film-formation rate of between 1.8 nm/sec and 10 nm/sec, such that the relative density of said solder layer before melting is at least 80% and no more than 99.9% of the theoretical density of said solder layer.

* * * * *